United States Patent
Pirovano et al.

(10) Patent No.: US 6,460,216 B1
(45) Date of Patent: Oct. 8, 2002

(54) CARD BRUSHING SYSTEM

(75) Inventors: Donato Pirovano, Vimercate; Luigi Penati, Carnate, both of (IT)

(73) Assignee: International Business Machines Corporation, Armonk, NY (US)

(*) Notice: Subject to any disclaimer, the term of this patent is extended or adjusted under 35 U.S.C. 154(b) by 28 days.

(21) Appl. No.: 09/633,695

(22) Filed: Aug. 7, 2000

(30) Foreign Application Priority Data

Aug. 10, 1999 (GB) .............................. 9918700

(51) Int. Cl.⁷ .............................. B08B 1/02; B08B 5/04
(52) U.S. Cl. .............................. 15/308; 15/88.2; 15/374
(58) Field of Search .................. 15/308, 88.2, 374

(56) References Cited

U.S. PATENT DOCUMENTS

| | | | | |
|---|---|---|---|---|
| 3,117,333 A | * | 1/1964 | Murray et al. | 15/1.51 |
| 3,470,576 A | * | 10/1969 | Gill | 15/100 |
| 3,946,454 A | | 3/1976 | Holm et al. | |
| 4,439,882 A | | 4/1984 | Holm | |
| 4,706,325 A | * | 11/1987 | Michelson | 134/122 P |
| 4,854,081 A | | 8/1989 | Pola et al. | |
| 5,613,286 A | * | 3/1997 | McCabe | 15/308 |
| 5,624,501 A | * | 4/1997 | Gill, Jr. | 134/32 |

FOREIGN PATENT DOCUMENTS

WO    WO 97/11791    4/1997

\* cited by examiner

*Primary Examiner*—Chris K. Moore
(74) *Attorney, Agent, or Firm*—Jay H. Anderson

(57) ABSTRACT

A brushing system to be used in the manufacturing of electronic card for removing unwanted particles from the substrate surface. According to a preferred embodiment of the present invention, the card to be cleaned (e.g. a SIMM card) is entered in a cleaning box where there are two motor brushes and a vacuum system. The two round brushes are inclined with respect to each other and form an angle of about 60°. The card passes through the apex of this angle while the brushes turn tangentially to the card. The particles are removed and pushed down where they are collected and eliminated by the vacuum system.

5 Claims, 1 Drawing Sheet

CARD BRUSHING SYSTEM

TECHNICAL FIELD

The present invention relates to the removal of particles from a substrate during the manufacture of electronic packages and particularly to a system and method for removing the particles by means of inclined brushes.

BACKGROUND OF THE INVENTION

In the manufacturing process of an electronic package (e.g. a SIMM or DIMM card), the mounting of a chip (device) on a substrate is usually done through soldering. This stage of the process needs to be performed in a "clean" environment to avoid that unwanted particles deposited on the module obtained. For this reason the whole process is carried on in a so-called "Clean Room". SIMM card, for example, are usually manufactured in panels of 10–12 pieces at a time and then cut into single cards. This cutting operation is usually done with a router-cutting machine, i.e. a machine having a rotating blade. It can happen that particles, produced during the cutting process, are deposited on the card in the form of dust. This dust is very dangerous, particularly when it is deposited on the cards gold electrical contacts and it could cause the card failure due to false electrical contacts, oxidation or even short circuits.

The removal of the particles from the card, before shipping is essential for the functionality of the final package. The presence of particles of any nature between the circuits of the substrate can be very harmful. This is particularly true when increasing reduction of dimensions in the electronic standards is considered.

What, in the past, used to be a "cosmetic" problem, with the reduced space between the circuit lines is becoming critical. It is likely that smaller and smaller particles will become more and more dangerous.

A technique which is normally used to remove the unwanted particles is to wash the modules with demineralised water. Another cleaning method of the prior art is by means of compressed air flow. These techniques, however do not give the assurance of a complete removal of the particles also because of the nature of these particles which are of the same material as the substrate and adhere to the card with a great strength. For this reason, a manual check with the aid of a microscope must be performed afterwards and the residual particles manually removed with brushes and scrapers.

It should be immediately evident that the above described technique is very laborious and also not completely reliable, because of the human intervention. Furthermore, the interruption of the mechanical handling of the modules for the manual checking and refinement leaves open the eventuality of contamination during the waiting times and the moving of the modules.

It is an object of the present invention to provide a technique which overcomes the above drawbacks.

SUMMARY OF THE INVENTION

According to the present invention, we provide a brushing system for removing unwanted particles from both faces of an electronic card, the system comprising:
brushing means for brushing said card faces, the brushing means including at least one couple of juxtaposed rotating brushes, each brush having the plane perpendicular to the axis of rotation of the brush forming an acute angle with the plane on which the card lies;
moving means for relatively moving the card and the brushing means, the card passing through said at least one couple of brushes.

BRIEF DESCRIPTION OF THE DRAWINGS

Various embodiments of the invention will now be described in detail by way of examples, with reference to accompanying figures, where.

DETAILED DESCRIPTION OF THE PREFERRED EMBODIMENT

According to a preferred embodiment of the present invention, the card to be cleaned (e.g. a SIMM card) is entered in a cleaning box where there are two motor brushes and a vacuum system. The two round brushes are inclined with respect to each other and form an angle of about 60°. The card passes through the apex of this angle while the brushes turn tangentially to the card. The particles are removed and pushed down where they are collected and eliminated by the vacuum system.

Figure 1:
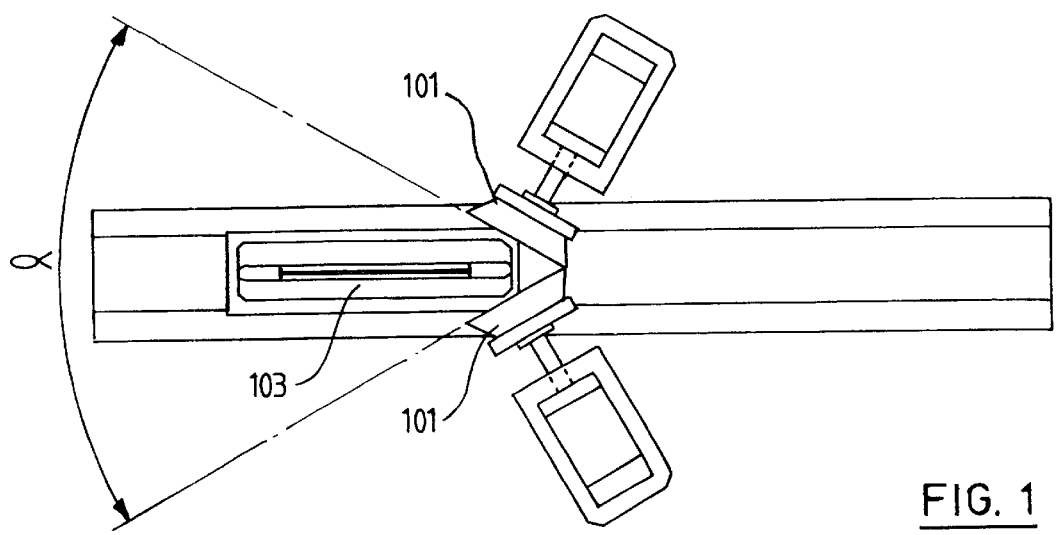
FIG. 1 shows schematically a plan view of a preferred embodiment of the present invention.

FIG. 1 shows a preferred embodiment of the present invention. Two rotating brushes 101 are installed on adjustable brackets one facing the other and inclined at an angle α between them. According to a preferred embodiment of the present invention, the rotation axis of the two brushes form an angle α of about 60°. Of course different inclinations can be used, but it is important that the brushes are neither parallel nor perpendicular to the card to be cleaned. With a rotating brush parallel (i.e. with the rotation axis perpendicular) to the surface to be clean, it has been discovered that some of the particles are just moved around on the surface, but not removed, because of the strong adhesion force between the particles and the substrate. On the other hand, a brush positioned perpendicularly with respect to the card surface (i.e. with the rotation axis parallel to the surface) has a poor impact on the card surface. In a preferred embodiment said angle α should be comprised between 30° and 90°. According to a preferred embodiment of the present invention, the card 103 to be cleaned passes between the rotating brushes 101 and both sides of the card are exposed to the brushing action. According to a preferred embodiment of the present invention the two brushes 101 are rotating in opposite senses, one clockwise, and the other anticlockwise removing the particles from top to bottom of the card 103 and pushing them downward.

Figure 2:
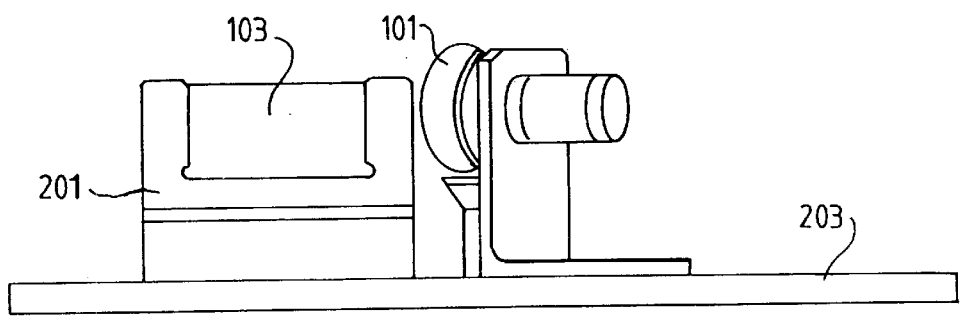
FIG. 2 shows schematically a side view of the preferred embodiment of the present invention shown in FIG. 1.

FIG. 2 shows a schematic side view of the apparatus of FIG. 1. According to a preferred embodiment of the present invention, the card 103 to be cleaned is placed vertically on a support 201, which moves on a linear rail 203. The movement is made by means of an air cylinder. The card 103 is moved at a constant speed through the inclined brushes system and may pass two or more times between the brushes.

Figure 3:
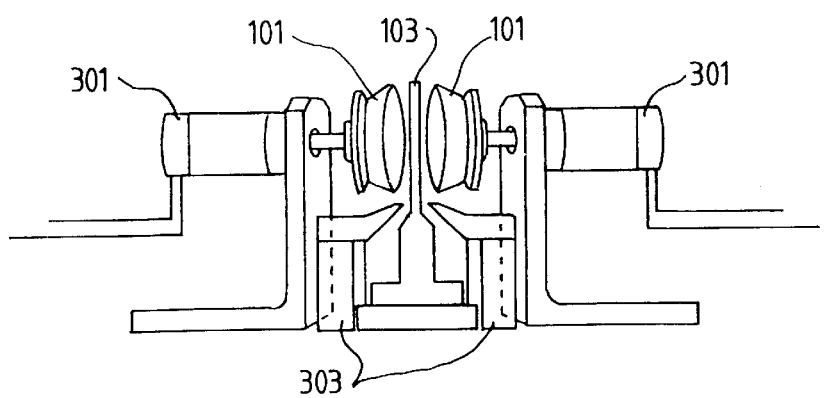
FIG. 3 shows schematically a front view of the same embodiment.

As shown in the front view of FIG. 3, according to a preferred embodiment of the present invention, a vacuum system 303 is provided under the brushes 101. This is to immediately eliminate all the particles removed by the brushes, in order to keep the working area and the brushes completely clean during the cleaning process. FIG. 3 also shows the motors 301 used to rotate the brushes.

What is claimed:

1. A brushing system for removing unwanted particles from both faces of an electronic card, the system comprising:

brushing means for brushing said card faces, the brushing means including at least one pair of juxtaposed rotating brushes, said pair of brushes facing each other and inclined with respect to each other at an acute angle;

support means for holding said electronic card such that said card faces are positioned between said pair of rotating brushes and in line with the apex of said acute angle; and moving means for relatively moving the card and the brushing means, the card passing through said at least one pair of brushes.

2. The system of claim 1 further comprising:

vacuum means provided under said pair of brushes for suctioning the removed particles.

3. The system of claim 2 wherein said brushing means are arranged so that the removed particles are pushed towards said vacuum means.

4. The system of claim 1 wherein said angle is between 15° and 45°.

5. The system of claim 4 wherein said angle is 30°.

* * * * *